United States Patent
Davari et al.

(10) Patent No.: US 6,756,257 B2
(45) Date of Patent: Jun. 29, 2004

(54) PATTERNED SOI REGIONS ON SEMICONDUCTOR CHIPS

(75) Inventors: Bijan Davari, Mahopac, NY (US); Devendra Kumar Sadana, Pleasantville, NY (US); Ghavam G. Shahidi, Elmsford, NY (US); Sandip Tiwari, Ithaca, NY (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 09/975,435

(22) Filed: Oct. 11, 2001

(65) Prior Publication Data

US 2003/0104681 A1 Jun. 5, 2003

Related U.S. Application Data

(62) Division of application No. 09/356,295, filed on Jul. 16, 1999, now Pat. No. 6,333,532.

(51) Int. Cl.[7] .......................... H01L 21/00; H01L 21/84
(52) U.S. Cl. ................ 438/151; 438/149; 438/243; 438/248; 438/386; 438/424; 438/515; 438/516; 438/522; 438/526; 438/528; 438/530
(58) Field of Search ................. 438/514, 515, 438/516, 522, 526, 528, 424, 530, 386, 243, 248, 149, 151

(56) References Cited

U.S. PATENT DOCUMENTS 5,494,846 A * 2/1996 Yamazaki
5,712,173 A * 1/1998 Liu et al.
5,963,798 A * 10/1999 Kim et al.
6,063,652 A * 5/2000 Kim
6,255,145 B1 * 7/2001 Ajmera et al.
6,281,593 B1 * 8/2001 Brown et al.
6,287,901 B1 * 9/2001 Christensen et al.
6,380,037 B1 * 4/2002 Osanai
6,429,099 B1 * 8/2002 Christensen et al.
6,465,852 B1 * 10/2002 Ju
6,472,753 B2 * 10/2002 Kondo et al.
6,476,445 B1 * 11/2002 Brown et al.

FOREIGN PATENT DOCUMENTS

JP          409064323 A    *  3/1997

* cited by examiner

*Primary Examiner*—Long Pham
(74) *Attorney, Agent, or Firm*—Scully, Scott, Murphy & Presser; Robert M. Trepp, Esq.

(57) ABSTRACT

A method and structure for forming patterned SOI regions and bulk regions is described wherein a silicon containing layer over an insulator may have a plurality of selected thickness' and wherein bulk regions may be suitable to form DRAM's and SOI regions may be suitable to form merged logic such as CMOS. Ion implantation of oxygen is used to formed patterned buried oxide layers at selected depths and mask edges may be shaped to form stepped oxide regions from one depth to another. Trenches may be formed through buried oxide end regions to remove high concentrations of dislocations in single crystal silicon containing substrates. The invention overcomes the problem of forming DRAM with a storage capacitor formed with a deep, trench in bulk Si while forming merged logic regions on SOI.

20 Claims, 11 Drawing Sheets

PATTERNED SOI REGIONS ON SEMICONDUCTOR CHIPS

This is a division of application Ser. No. 09/356,295, filed Jul. 16, 1999, now U.S. Pat. No. 6,333,532.

FIELD OF THE INVENTION

This invention relates to Silicon-On-Insulator (SOI) semiconductor chips and more particularly to patterned regions of SOI in bulk semiconductor material and further, to trenches formed at the perimeter of respective SOI regions to provide electrical isolation and to remove or control crystalline defects.

BACKGROUND OF THE INVENTION

It is well known that SOI based logic circuits show 20–30% higher performance than logic circuits comparably made on bulk-Si. Currently, Si wafers are ion implanted with oxygen such as $10^{18}$ atoms/cm$^2$ to form a buried oxide region beneath the surface of the Si. The Si wafers are annealed to form a continuous buried oxide layer (BOX) beneath the surface that isolates electrically the top Si layer from the bulk Si below the BOX. The above process for making SOI wafers is known in the art as separation by implantation of oxygen (SIMOX). SOI wafers are then processed to form devices and/or circuits therein.

In the fabrication of CMOS circuits on bulk Si, shallow trench isolation (STI) has been used to provide electrical isolation between devices. A shallow trench is formed, filled with an insulator and then planarized by Chemical Mechanical Polishing (CMP).

In the fabrication of Dynamic Random Access Memories (DRAM), memory cells consisting of a field effect transistor and a capacitor have been used. IBM Corp. has developed the use of a deep trench capacitor for the memory cell such as described in U.S. Pat. No. 4,688,063 which issued Aug. 18, 1987 by Lu et al. entitled "Dynamic Ram Cell With MOS Trench Capacitor In CMOS." A deep trench is formed and then the sidewalls and bottom are oxidized or coated with an insulator followed by filling the trench with a conductor such as doped poly silicon.

SUMMARY OF THE INVENTION

In accordance with the present invention, a structure for forming electrical devices therein and a method for making is described comprising a semiconductor substrate containing Si having an upper surface, and a plurality of spaced apart buried oxide regions formed by ion implantation of oxygen therein through openings in a patterned mask to provide a plurality of buried oxide regions under the surface of a single crystal silicon containing layer.

The invention further provides a method for forming a semiconductor layer over an insulator comprising the steps of forming a first mask on a substrate containing Si, implanting oxygen through the mask into the substrate and annealing the substrate to form a patterned buried oxide layer and a semiconductor layer there over.

The invention further provides a structure and method for forming bulk semiconductor regions and SOI regions on a wafer with trenches positioned at or near the perimeter of the SOI regions to provide electrical isolation and to control crystalline defect propagation and effects.

The invention further provides a structure and method for forming embedded DRAM and merged logic by forming Bulk Si regions with DRAM formed therein and SOI regions with merged logic (CMOS) formed therein.

BRIEF DESCRIPTION OF THE DRAWING

These and other features, objects, and advantages of the present invention will become apparent upon consideration of the following detailed description of the invention when read in conjunction with the drawing in which:

FIGS. 4 and 5 show fourth and fifth embodiments of the invention with patterned SOI regions with insulation there between.

DESCRIPTION OF THE PREFERRED EMBODIMENTS

Figure 1:
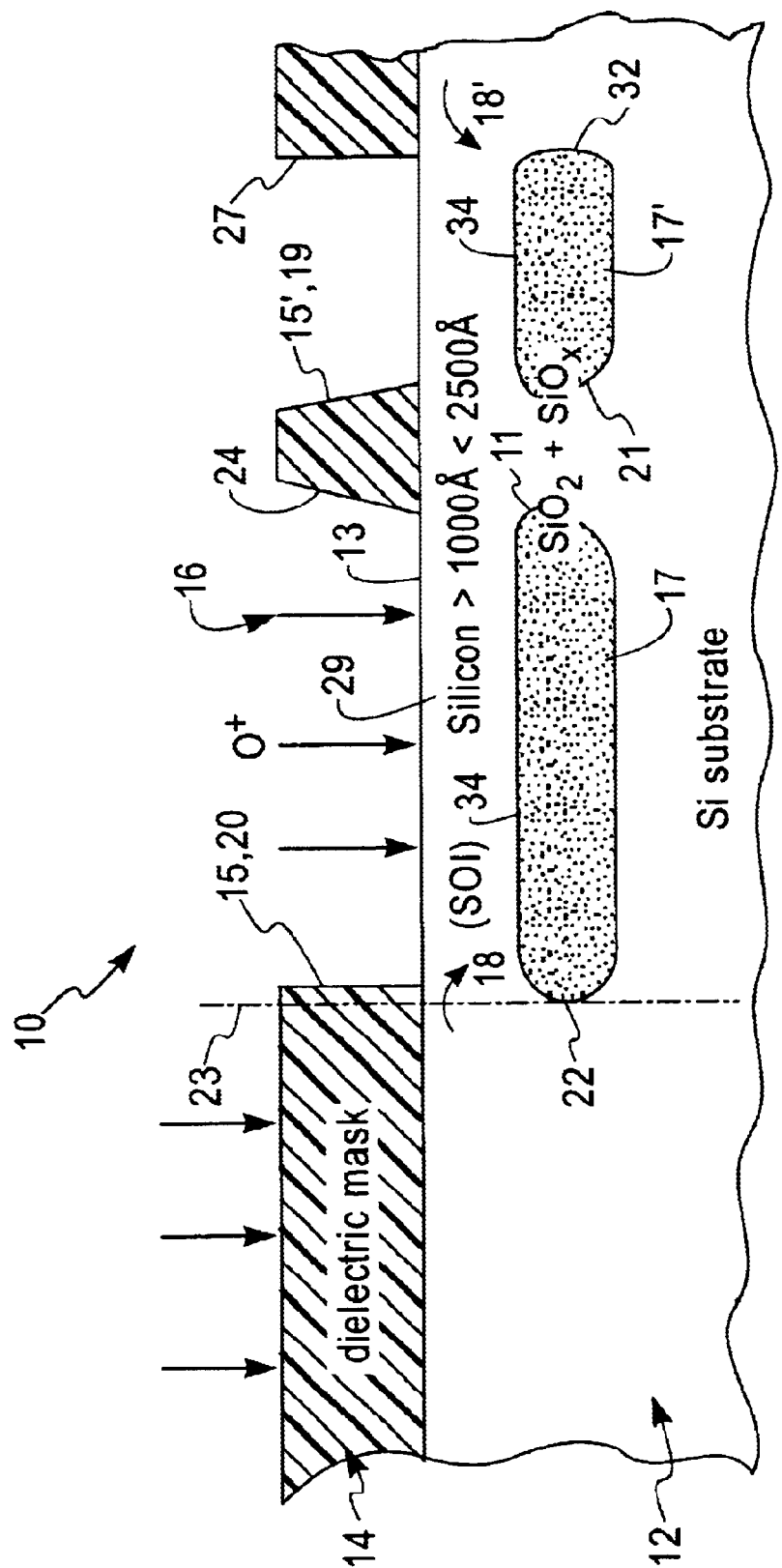
FIG. 1 shows a first embodiment of the invention with patterned buried oxide regions under a thick silicon containing layer.

Referring now to the drawing, FIG. 1 shows an SOI structure 10 having a substrate 12 of a poly or single crystalline semiconductor material containing Si such as Si alone, SiGe, SiC, with a major upper surface 13. On major surface 13, a dielectric mask 14 is formed. Dielectric mask 14 may be of a material such as $SiO_2$, $Si_3N_4$, polysilicon, diamond-like-carbon, $Al_2O_3$ or combinations thereof. Dielectric mask 14 is lithographically patterned to form openings 15 and 15'. Mask 14 may be formed with one or more patterned dielectric layers.

A source of ions such as $O^+$, $O_2$, $O_3$ and higher charge state ions 16 are directed at surface 13 of substrate 12. Ions 16 are blocked from entering substrate 12 where mask 14 remains and ions 16 pass through openings 15 and 15' through exposed surface 13 into substrate 12 to form buried oxide regions 17 and 17' and corresponding SOI regions 18 and 18' below openings 15 and 15'. The penetration depth of ions 16 is a function of the ion energy from the ion source. The ion source may be an ion implanter having an energy range from 60 to 210 keV which is commercially available from IBIS Corporation, Danvers, Mass. The energy of ions 16 may be in the range from 30 keV to 10 MeV with special equipment being fabricated to provide an ion source for either the high or low end of the energy range. Ions 16 may have insufficient energy to penetrate mask 14 to leave substrate 12 below mask 14 free of oxygen ions 16 so as to be suitable for electronic devices. To prevent any ions 16 from penetrating through mask 14, mask 14 should have a thickness preferably equal to the projected range ($R_p$) plus 6 times the straggle distance ($\Delta R_p$) of the gaussian distribution. In FIG. 1, buried oxide regions 17 and 17' may have a thickness in range from 200 Å to 2 microns. The Si containing overlayer 29 above buried oxide regions 17 and 17' may have a thickness in the range from 100 Å to 4 microns. Buried oxide regions 17 and 17' may be stoichiometric or non-stoichiometric mixed with Si (crystalline or amorphous), $SiO_x$, N, $SiN_x$, C and $SiC_x$.

The edge 20 of mask 14 is over edge 22 of buried oxide region or layer 17. The edge 24 of mask 14 is over edge 11 of buried oxide region 17. The edge 19 of mask 14 is over edge 21 of buried oxide region 17'. The edge 27 of mask 14 is over edge 32 of buried oxide region 17'. The edges 20, 24, 19 and 27 of mask 14 and the respective edges 22, 11, 21 and 32 of buried oxide regions 17 and 17' may be offset with respect to one another to overlap or to be spaced apart. Buried oxide regions 17 and 17' may extend laterally underneath the edges of mask 14 which is normal in typical processing; or, buried oxide regions 17 and 17' could be fabricated so that edges 22, 11, 21 and 32 are spaced apart from edges 20, 24, 19 and 27 respectively of mask 14. The shape of buried oxide edges 22, 11, 21 and 32 are a function of the physical shape of the edges of mask 14. Mask edge 24 is bevelled or slanted in the range from 10 to 70 degrees with respect to an axis 23 which is orthogonal to surface 13. Angled implantation of ions 16 at angles other than 90 degrees may be in the range from 10 to 90 degrees with respect to surface 13 which is used to move the edges 22, 11, 21 and 32 of the buried oxide layers 17 and 17' away-from or underneath the edges 20, 24, 19 and 27 of mask 14. Overlap distances or the spaced apart distances to edges 20 and 22, for example, are measured with respect to an orthogonal axis 23 when passing through the respective edges being measured.

Figure 2A:
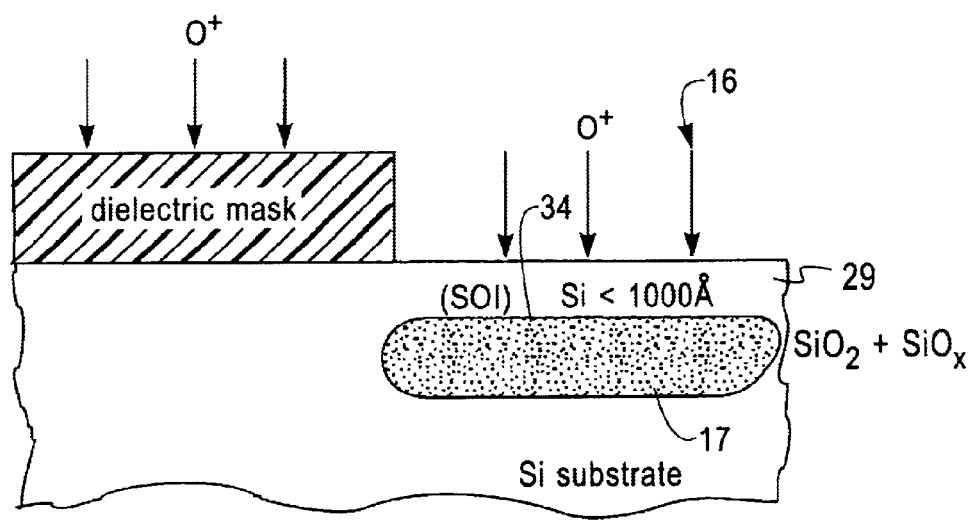
FIG. 2A shows a second embodiment of the invention with patterned buried oxide regions under a thin silicon containing layer.
Figure 2B:
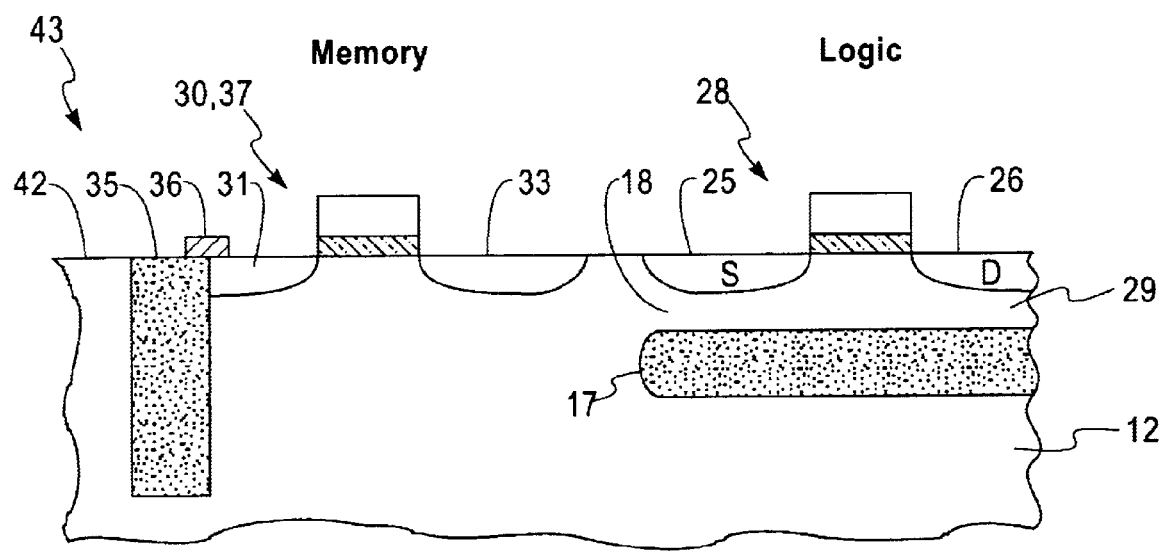
FIG. 2B shows FET's and a capacitor formed in the second embodiment of FIG. 2A to form embedded DRAM and merged logic.

In FIG. 1, the silicon thickness along with the doping (p or n)) level may be adjusted so that the depletion region from source/drain junctions do not touch or interface with the upper surface 34 of buried oxide layer 17 as shown in FIG. 2B.

In FIGS. 2A and 2B like references are used for functions corresponding to the apparatus of FIG. 1. In FIG. 2A, ions 16 of lower energy are used to form buried oxide 17 at a shallower depth and hence a thinner Si layer 29 such as less than 1000 Å thick over buried oxide layer 17. In FIG. 2B, the silicon thickness along with the p or n doping level is adjusted to either allow the depletion region of source 25 and drain 26 of Field Effect Transistor (FET) 28 to interface or not to interface with the upper surface 34 of buried oxide layer 17. The source 25 and drain 26 itself may interface with upper surface 34 of buried oxide layer 17 depending on the thickness of silicon containing over layer 29.

FIG. 2B shows a FET 28 having a source 25 and drain 26 formed in Si containing over layer 29 above buried oxide layer 17. An FET 30 having a source 31 and drain 33 is formed in Si containing substrate 12, a bulk Si region without buried oxide layer 17 below. FET's 28 and 30 may be formed concurrently or at separate times. Next to FET 30 is a trench capacitor 35 which may be formed coupled to FET 30 by way of conductor strap 36 to form a memory cell 37 of an array of memory cells 43 in bulk semiconductor region 42. The structure of patterned SOI regions 18 with non patterned bulk semiconductor regions 42 permits the formation of embedded memory 43 in the form of RAM or DRAM in the bulk semiconductor region 42 with logic circuitry formed from FET's such as CMOS formed in SOI regions 18 in Si containing over layer 29.

Figure 3:
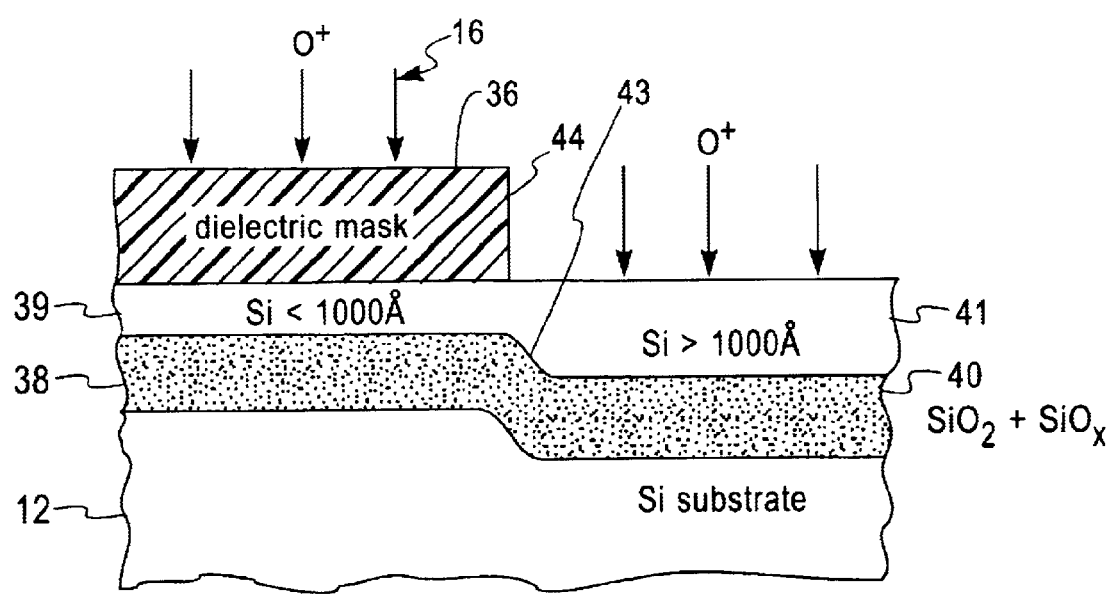
FIG. 3 shows a third embodiment of the invention with a plurality of independent thickness' of buried oxide regions.

FIG. 3 shows a mask 36 which is adjusted in thickness to permit some ions 16 to pass through mask 36 into substrate 12 to form a buried oxide region 38 having a Si layer 39 above of a thickness less than 1000 Å and to form a buried oxide region 40 at a second depth where no mask or a thinner mask (not shown) is intercepting ions 16 to form Si layer 41 having a thickness greater than 1000 Å.

In a first case, the mask thickness of mask 36 is selected to determine the depth of buried oxide 38 which would be less than the depth of buried oxide 40 where no mask intercepts ions 16. A second case is described where the same structure in FIG. 3 can be achieved by a thicker mask 36 and with a higher energy of ions 16. The two buried oxide regions 38 and 40 join together or are continuous from buried oxide region 38 to buried oxide region 40 with a step 43 in buried oxide depth between them corresponding to the location of the edge of mask 36 above. The shape of step 43 is determined by the positions of buried oxide regions 38 and 40 and by the shape of edge 44 of mask 36. It is understood that a plurality of thickness' of mask 36 may be used in conjunction with the energy of ions 16 to provide a silicon containing over layer with a plurality of thickness' in addition to over layer 39 and 41.

Figure 4:
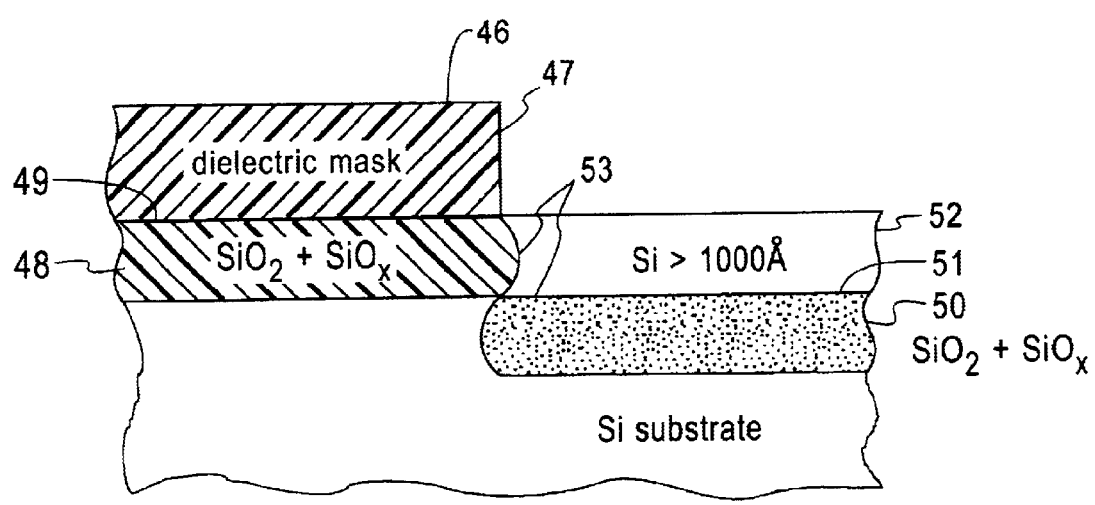

FIG. 4 shows a mask 46 which is adjusted in thickness to permit some ions 16 to pass through mask 46 into substrate 12 to form a buried oxide region 48 extending to the surface 49 and to form a buried oxide region 50 at a second depth where no mask or a thinner mask is intercepting ions 16. The silicon thickness of Si layer 52 can be adjusted in a manner described in FIGS. 2A and 2B.

In a first case, the mask thickness of mask 46 is selected to determine the depth of buried oxide 48 which will extend to the surface of substrate 12. A second case is described where the same structure in FIG. 3 can be achieved by a thicker mask 46 and with a higher energy of ions 16. The two buried oxide regions 48 and 50 join together or are continuous from buried oxide region 48 to buried oxide region 50 with a step 53 in buried oxide depth between them. The shape of step 53 is determined by the positions of buried oxide regions 48 and 50 and by the shape of edge 47 of mask 46.

In FIG. 4, the silicon thickness of Si layer 52 along with the n or p doping level is adjusted so that the depletion region from source/drain junctions to be subsequently formed do or do not touch or intersect upper surface 51 of the buried oxide 50.

Figure 5:
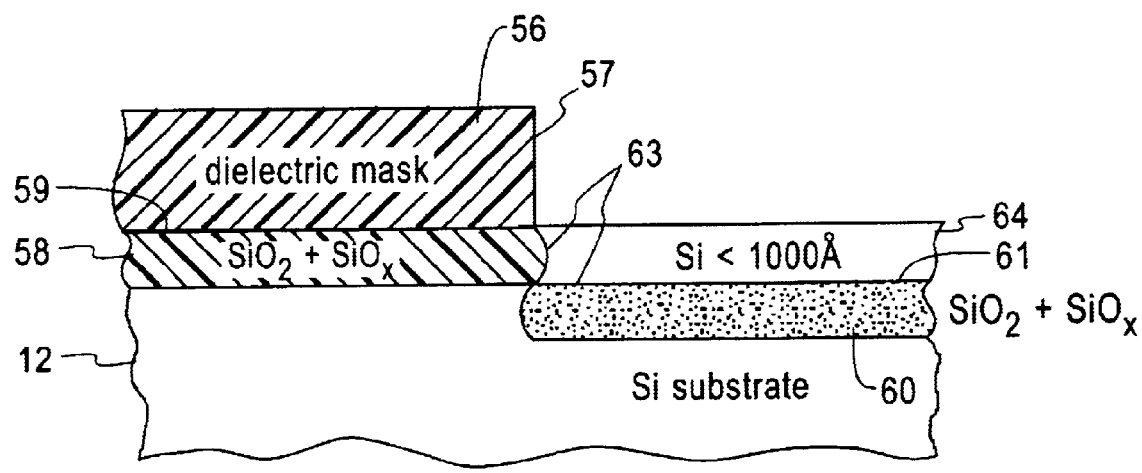

FIG. 5 shows a mask 56 which is adjusted in thickness to permit some ions 16 to pass through mask 56 into substrate 12 to form a buried oxide region 58 extending to the surface 59 of substrate 12 and to form a buried oxide region 60 at a second depth where no mask or a thinner mask is intercepting ions 16. The silicon thickness can be adjusted by adjusting the energy of ions 16 as described with respect to FIGS. 2A and 2B.

In a first case, the mask thickness is selected to determine the depth of buried oxide 58 which will extend to the surface 59 of substrate 12. A second case is described where the same structure in FIG. 4 can be achieved by a thicker mask 56 and with a higher energy of ions 16. The two buried oxide regions 58 and 60 join together or are continuous from buried oxide region 58 to buried oxide region 60 with a step 63 in buried oxide depth between them. The shape of the step is determined by the positions including the depth of buried oxide regions 58 and 60 and by the shape of mask edge 57 of mask 56.

In FIG. 5, the silicon thickness of Si layer 64 may be less than 1000 Å and is adjusted in thickness and doping to either allow the depletion region from a subsequently formed source/drain region to touch, extend to, or intersect upper surface 61 of the buried oxide 60 or the source/drain region itself contacts the upper surface 61 of buried oxide 60.

Figure 6:
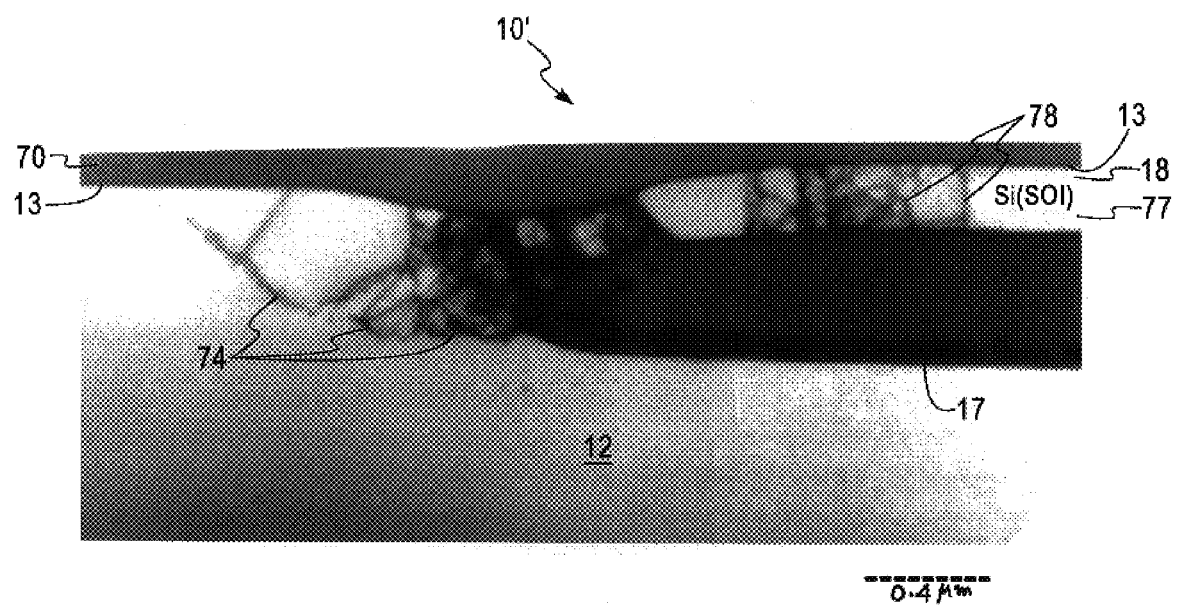
FIG. 6 is a cross section view taken with Transmission Electron Microscopy (TEM) of the embodiment of FIG. 1 exposed to a high dose of oxygen.

FIG. 6 shows a TEM cross section micrograph of a patterned SOI structure 10' similar to FIG. 1 without mask 14 and with oxide layer 70 formed on surface 13 of substrate 12 and SOI region 18. The thickness of buried oxide 17 corresponds to the following implant conditions: oxygen energy about 200 keV, oxygen dose about $1.8 \times 10^{18}$ atoms $cm^{-2}$, implant temperature about 570° C., and annealing at about 1320° C. for 6 hours in nitrogen mixed with 2–3% oxygen. FIG. 6 shows a dense array of dislocations 74 in substrate 12 at the edge of SOI region 18 and dislocations 78 at the end of Si containing layer 77 or near it where internal stresses are high in SOI region 18. The crystalline dislocations are above $1 \times 10^8$ $cm^{-2}$, in substrate 12 and SOI region 18 at the mask edge region of mask 14 (not shown) and at a physical dip or depression in silicon surface 13. FIG. 6 shows oxide layer 70 above buried surface 13 grown during the step of annealing which may be removed after the step of annealing by wet etching in dilute hydrofluoric (HF) acid.

Figure 7:
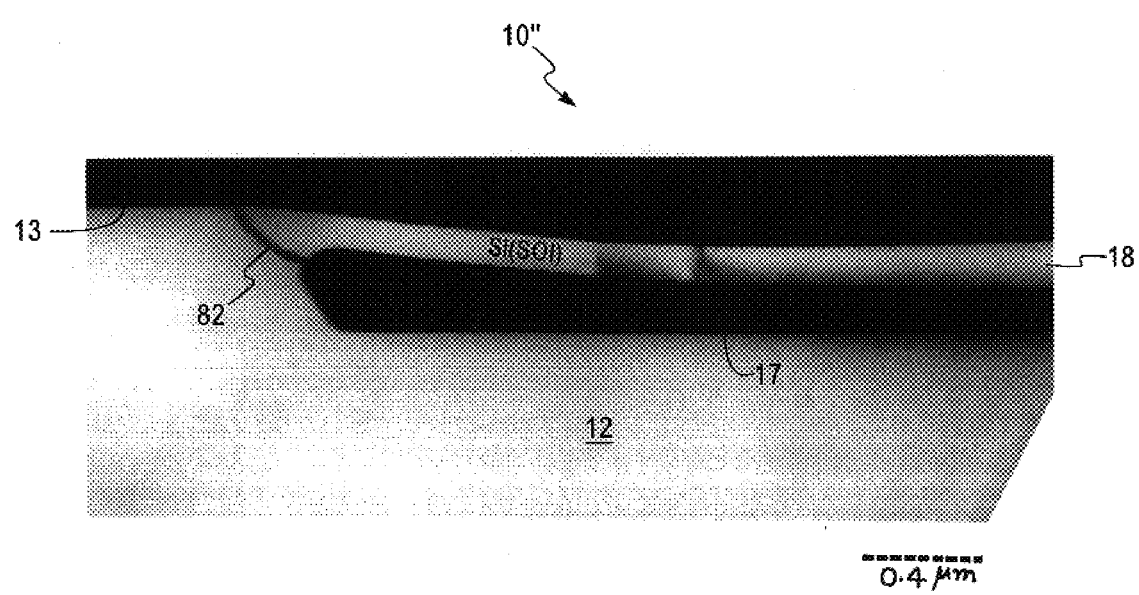
FIG. 7 is a cross section view taken with Transmission Electron Microscopy (TEM) of the embodiment of FIG. 2 exposed to a low dose of oxygen.

FIG. 7 shows a TEM cross section micrograph of a patterned SOI structure 10" similar to FIG. 1 without mask 14. The thickness of buried oxide layer 17 corresponds to the following implant conditions: oxygen energy about 200 keV, oxygen dose about $2 \times 10^{17}$ atoms $cm^{-2}$, implant temperature about 570° C., room temperature implant and annealing at about 1320° C. for 22 hours in argon mixed with at first times with 30–40% oxygen for about 12 hours and then at second times with 2–3% oxygen for about 10 hours. The steps of implanting at about 570° C., room temperature implanting and then annealing at about 1320° C. are described in Ser. No. 08/995,585 filed Dec. 22, 1997 (YO997117A allowed) by D. K. Sadana and J. P. de Souza entitled "Defect Induced Buried Oxide (DIBOX) For Throughput SOI" which is assigned to the assignee herein and is incorporated herein by reference. A method for forming SOI is also described in Ser. No. 09/034,445 filed Mar. 4, 1998 (YO996–264) by D. K. Sadana and O. W. Holland entitled "Method Of Forming Buried Oxide Layers In Silicon" which is assigned to both the assignee herein and Lockheed Martin Energy Research Corporation and which is incorporated herein by reference. FIG. 7 shows a few (three) dislocations 82 (about $1 \times 10^7$ $cm^{-2}$) in substrate 12 which is substantially better than that shown in FIG. 6 at the mask edge region of mask 14 (not shown) and a dip in silicon surface 13. Layer 86 is shown above buried surface 13 of substrate 12 and is an oxide layer grown during the step of annealing which may be removed after the step of annealing by wet etching in dilute HF acid.

Figure 8:
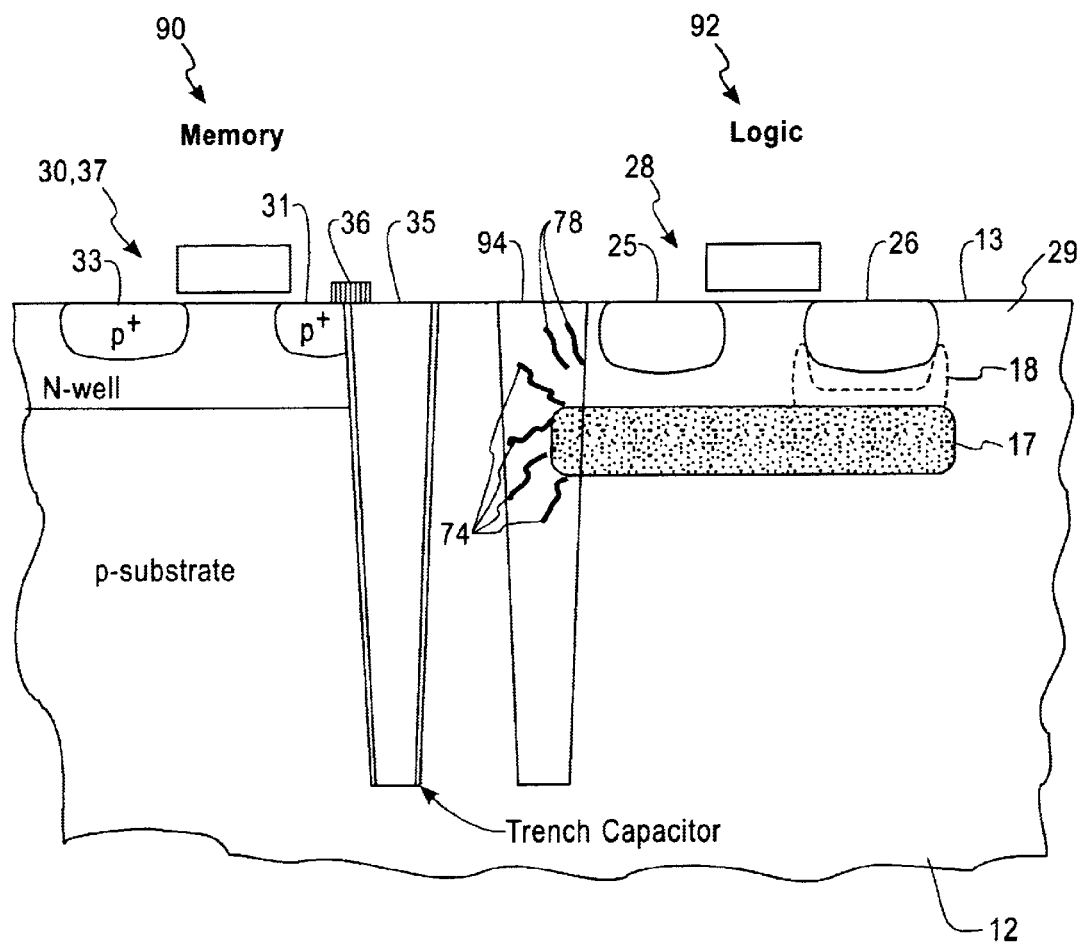
FIG. 8 is a sixth embodiment of the invention showing trench structures to replace crystalline defect regions and/or to block defects emanating from regions having high dislocations or to control crystallographic defects between SOI regions and bulk regions.

FIG. 8, shows an embedded DRAM 90 and merged logic 92 separated by a trench 94. Trench 94 is positioned to remove crystalline defects such as dislocations 74 in substrate 12 and dislocations 78 in or at the edge of SOI region 18 due to the stress during formation of buried oxide layer 17 as shown in FIGS. 6 and 7. Trench 94 functions to remove crystalline dislocations and defects and thereby prevent dislocations and other defects from propagating into substrate 12 or into Si layer 29. In FIG. 8, like references are used for functions corresponding to the apparatus of FIG. 2B. Trench 94 may be a deep trench in the range from 1 to 10 microns formed by reactive ion etching (REI) or trench 94 may be a shallow trench having a depth in the range from 0.05 to 1 microns to intersect with buried oxide layer 17. Trench 94 may provide electrical isolation to layer 29 and between embedded DRAM 90 and merged logic 92. Merged logic 92 may have field effect transistors of both n and p type interconnected to form CMOS logic. FIG. 8 shows field effect transistor 28 having source 25 and drain 26 in layer 29. Layer 29 may have a thickness determined by the depth of buried oxide 17 and p or n doping at a concentration wherein the depletion region in layer 29 extends or does not extend to the upper surface of buried oxide layer 17. By the depletion region extending to the upper surface of buried oxide layer 17, the capacitance of the drain and source are reduced. Where the depletion region from source 25 and drain 26 in layer 29 from field effect transistor 28 does not interface with buried oxide layer 17, the field effect transistor operates in a partial depletion mode which eliminates the kink effect in the $I_d$ versus $V_d$ graph at constant gate voltage due to the floating body effect i.e. charge accumulation below the channel.

In place of a single trench 94, a plurality of trenches 94 may be formed side by side parallel to one another such as where trench 35 is located to remove dislocations and to provide electrical isolation. Trench or trenches 94 may have their respective sidewalls and bottom oxidized to form an insulator such as $SiO_2$ and filled with an oxide or a polysilicon. Selective placement of trenches 94 may also provide thermal dissipation from layer 29 or the top of substrate 12 to substrate 12 below. To increase thermal conductivity, trench 94 may be filled with a thermally conductive material such as a conductive oxide, metal or doped polysilicon.

Figure 9:
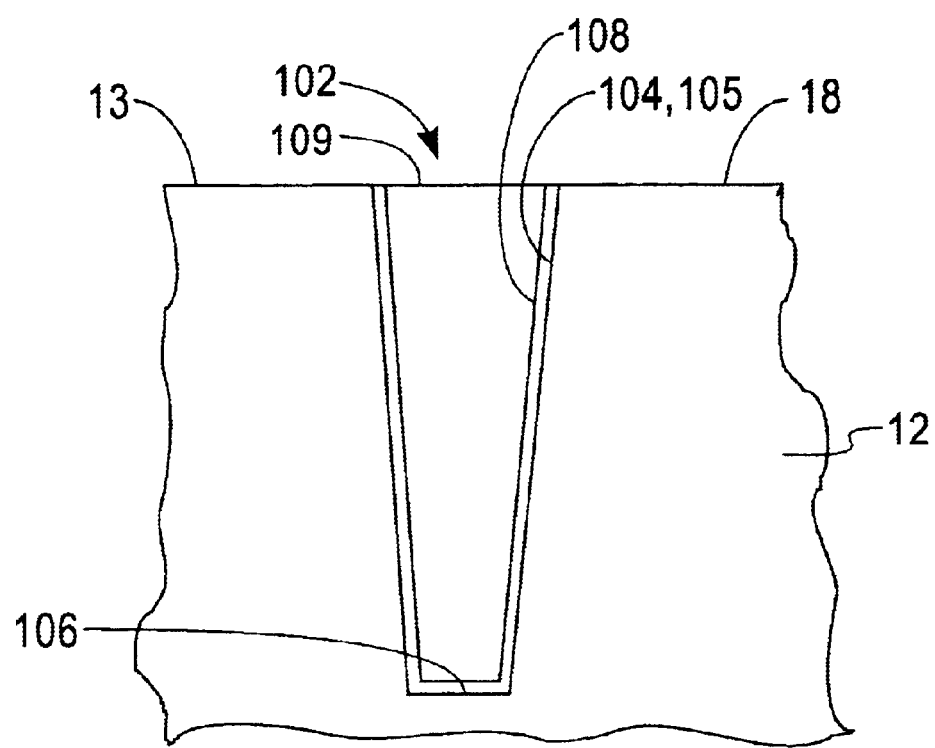
FIG. 9 shows a first decoupling capacitor in a bulk semiconductor substrate region.

Referring to FIG. 9, a decoupling capacitor 102 is shown formed in substrate 12 in bulk semiconductor region 38 of substrate 12 which may be adjacent one or more patterned SOI regions 18. A trench 104 is formed in upper surface 13 in substrate 12. The sidewalls 105 and bottom 106 of trench 104 are covered by a layer of dielectric 108 such as silicon dioxide, silicon nitride or combinations thereof. Trench 104 may be filled with a conductive material 109 such as p+ or n+ doped polysilicon or a metal. The top surface of conductive material 109 may be planarized to be, for example, coplanar with surface 13 by chemical mechanical processing (CMP).

Figure 10:
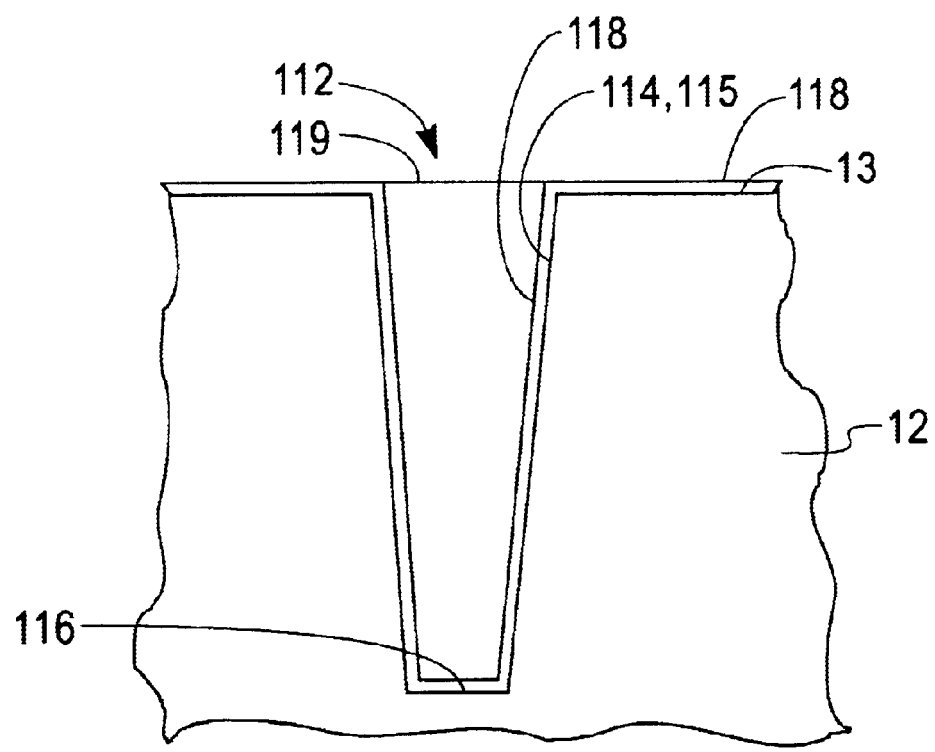
FIG. 10 shows a second decoupling capacitor in a bulk semiconductor substrate region.

Referring to FIG. 10, a decoupling capacitor 112 is shown formed in substrate 12 in a bulk semiconductor region 18 of substrate 12 which may be adjacent one or more patterned SOI regions 38. A trench 114 is formed in upper surface 13 in substrate 12. The sidewalls 115 and bottom 116 of trench 114 and surface 13 are covered by a layer of dielectric 118 such as silicon dioxide, silicon nitride or combinations thereof. Trench 114 may be filled with a conductive material 119 such as p+ or n+ doped polysilicon or a metal. The top surface of conductive material 119 may be planarized to be, for example, coplanar with the top surface of dielectric 118 by a process such as CMP.

Figure 11:
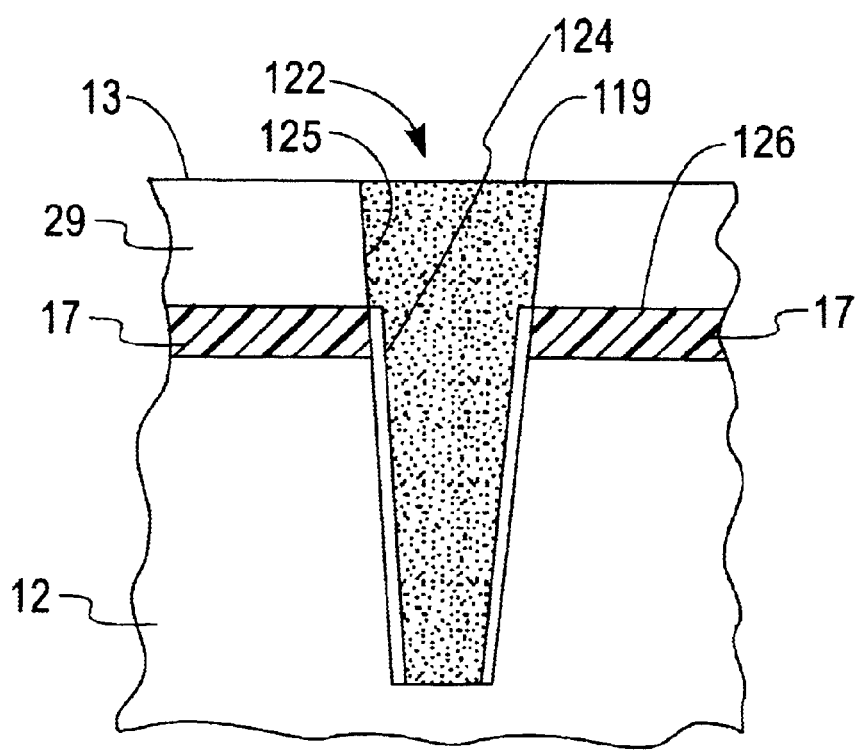
FIG. 11 shows a first body contact embodiment incorporating a trench.

Referring to FIG. 11, a body contact 120 for field effect transistors 28 shown in FIGS. 2B and 8 is shown by making electrical contact between layer 29 and substrate 12 below buried oxide layer 17. A trench 122 is formed from surface 13 through layer 29, through buried oxide layer 17 and into substrate 12. Trench 122 may have a dielectric layer 124 on sidewalls 125 from the bottom of sidewall 125 to the upper surface 126 of buried oxide layer 17. Trench 122 may be filled with conductive material 119 such as a conductive oxide, p+ or n+ polysilicon or metal.

Figure 12:
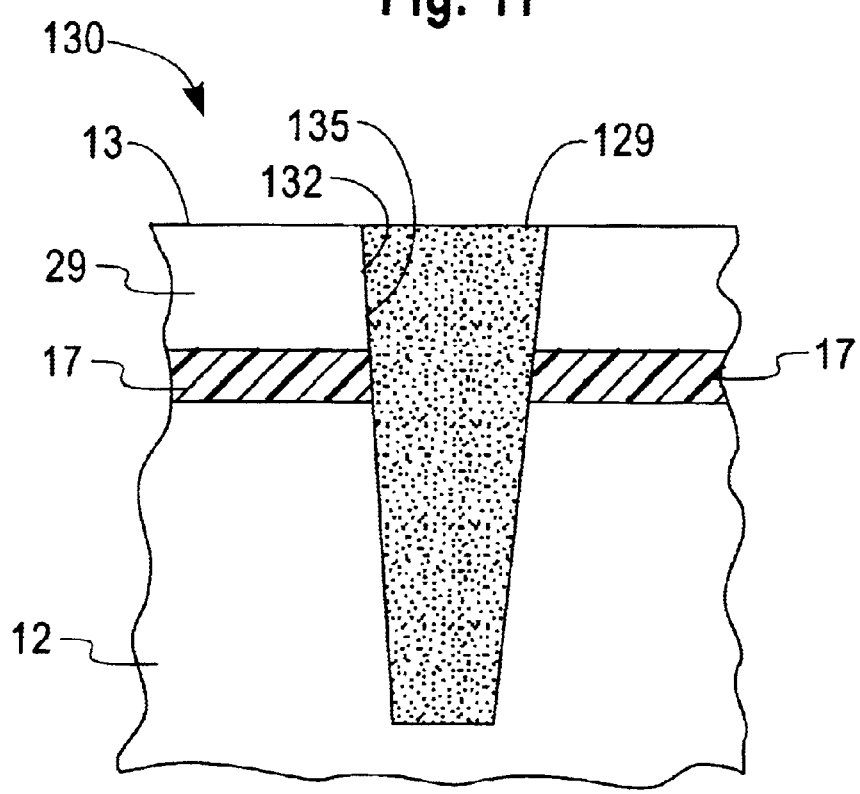
FIG. 12 shows a second body contact embodiment incorporating a trench.

Referring to FIG. 12, a body contact 130 for field effect transistors 28 shown in FIGS. 2B and 8 is shown by making electrical contact between layer 29 and substrate 12 below buried oxide layer 17. A trench 132 is formed from surface 13 through layer 29, through buried oxide layer 17 and into substrate 12 for a predetermined depth. Trench 132 has sidewalls 135. Trench 132 may be filled with a conductive material 129 such as a conductive oxide, p+ or n+ polysilicon or metal.

Figure 13:
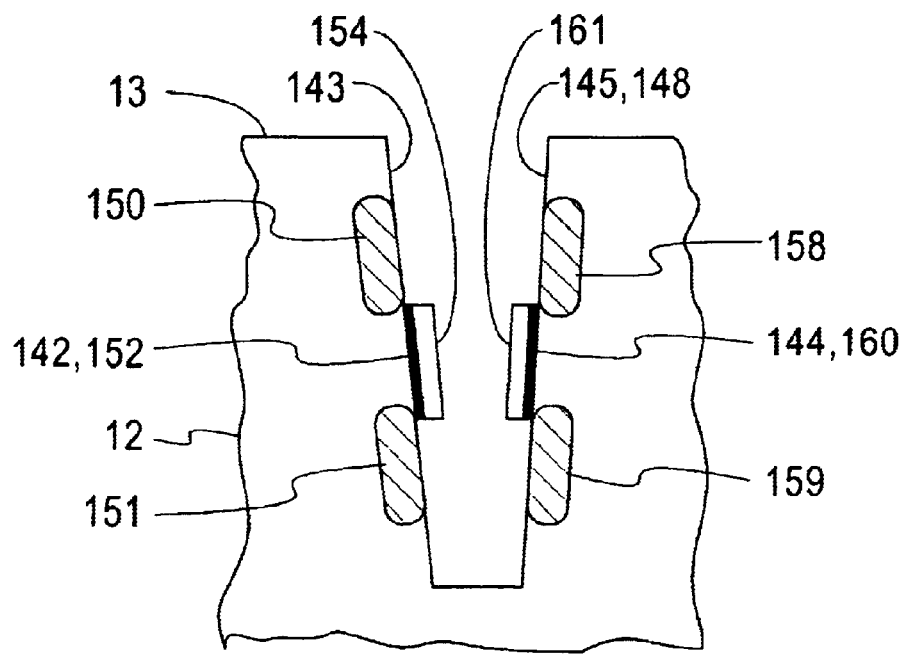
FIG. 13 shows field effect transistors formed on sidewalls of a trench formed in a bulk semiconductor region.

Referring to FIG. 13, field effect transistors 142 and 144 are shown formed on sidewalls 143 and 145 respectively in trench 148. Field effect transistor 142 comprises source 150, drain 151, gate dielectric 152 and gate electrode 154. Field effect transistor 144 comprises source 158, drain 159, gate dielectric 160, and gate electrode 161.

Figure 14:
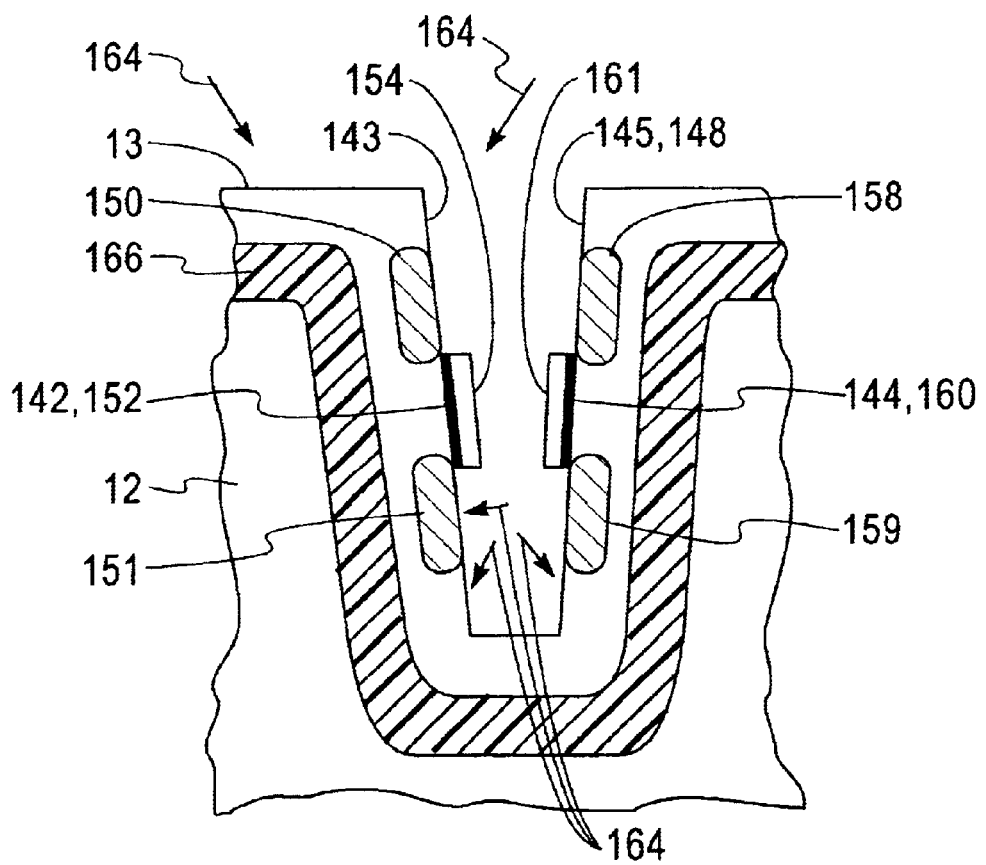
FIG. 14 shows field effect transistors formed on sidewalls of a trench having a buried oxide layer beneath the sidewalls.

Referring to FIG. 14, field effect transistors 142 and 144 are shown formed on sidewalls 143 and 145 respectively in trench 148. Trench 148 is formed such as by reactive ion etching (RIE) through the upper surface 13 of substrate 12 which may contain silicon. Next, oxygen ions 164 are implanted through surface 13 and into and beneath sidewalls 143 and 145 of trench 148 by plasma immersion ion implantation to form a buried oxide layer 166. Plasma immersion ion implantation is an isotropic process for implanting oxygen ions shown by arrows 164 from an effective non-directional source.

In FIGS. 1–14, like references are used for an apparatus corresponding to an apparatus in an earlier Figure.

While there has been described and illustrated a structure having patterned buried oxide regions and a process for making such as patterned SOI semiconductor regions having one or more Si layer thickness'; patterned SOI semiconductor regions having SOI regions and bulk silicon containing regions where, for example, DRAM's may be formed in bulk regions and CMOS logic may be formed in SOI regions; and patterned SOI regions having SOI and bulk silicon containing regions with deep or shallow trenches therebetween, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method for forming a structure comprising the steps of:
    forming a first mask having openings therein on a surface of a silicon containing substrate, said first mask further having first regions of a first thickness to permit ions of oxygen to pass there through into said substrate with reduced energy,
    implanting oxygen through said openings and said first mask into said substrate, and
    annealing said substrate to form a plurality of first buried oxide regions below a silicon contain layer and a plurality of second buried oxide regions in said substrate, whereby said second buried oxide regions are shallower than the first buried oxide regions.

2. The method of claim 1 wherein said step of implanting oxygen includes the step of selecting an ion energy to form said silicon containing layer having a thickness of less than 1000 Å.

3. The method of claim 1 wherein said step of implanting oxygen includes the step of selecting an ion energy to form said silicon containing layer having a thickness of at least 1000 Å.

4. The method of claim 1 wherein said step of forming a first mask includes the step of forming at least one of said first regions adjacent a respective opening to form upon said step of annealing a second buried oxide region contiguous with one of said plurality of first buried oxide regions.

5. The method of claim 1 further including the step of removing said first mask prior to said step of annealing.

6. The method of claim 1 wherein said step of implanting includes the step of implanting at an angle with respect to the surface of said silicon containing substrate.

7. The method of claim 6 wherein said step of implanting includes the step of implanting at an angle in the range from 10 to 90 degrees.

8. The method of claim 1 further including the step of forming a field effect transistor in said silicon containing layer.

9. The method of claim 1 further including the step of forming a trench in said silicon containing substrate at the edge of at least one of said silicon-on-insulator regions.

10. The method of claim 9 wherein said step of forming a trench includes the step of forming said trench to intersect an edge of said buried oxide region of said silicon-on-insulator region to remove a portion of the end of said buried oxide.

11. The method of claim 9 further including the step of filling said trench with a material selected from the group consisting of p+ polysilicon, n+ polysilicon and a metal.

12. The method of claim 1 further including the step of forming a trench in said silicon containing substrate through one of said silicon-on-insulator regions.

13. A method for a structure comprising the steps of:
    forming a first mask having openings therein on a surface of a silicon containing substrate, said first mask has a slanted edge at at least one of said openings at an angle with respect to an axis which is orthogonal to the surface of the silicon containing substrate
    implanting oxygen through said openings in said first mask and through said slanted edge into said substrate, and
    annealing said substrate to form a plurality of first buried oxide regions below a silicon contain layer, said first buried oxide regions and said silicon containing layer are located in said substrate, whereby said spaced apart silicon-on-insulator regions are formed and at least one of said first buried oxide regions has a shaped edge.

14. The method of claim 13 wherein said angle of said slanted edge is in the range from 10 to 70 degrees.

15. A method for forming a structure for forming semiconductor circuits comprising the steps of:
    selecting a semiconductor substrate containing silicon having a plurality of trenches therein;
    forming a first mask on said substrate having an opening to expose a trench portion, and
    implanting oxygen through openings in said first mask into said substrate and said trench portion, said step of implanting including the step of plasma immersion ion implantation of oxygen whereby oxygen ions pass through the sidewalls of said trench portion to form a buried oxide layer with respect to said sidewalls.

16. The method of claim 15 further including the step of forming a gate dielectric on the sidewalls of said trench.

17. The method of claim 16 further including the step of forming a gate electrode on said gate dielectric on said sidewalls in said trench.

18. The method of claim 15 further including the step of covering a portion of at least one trench having sidewalls that extend to a common bottom wall with said first mask to prevent formation of a buried oxide layer with respect to said sidewalls and common bottom wall of said at least one trench.

19. The method of claim 18 further including the step of forming a capacitor in said trench.

20. The method of claim 18 further including the step of forming an electrical contact on the sidewalls and bottom of said at least one trench.

\* \* \* \* \*